(12) United States Patent
Sonobe et al.

(10) Patent No.: US 8,253,258 B2
(45) Date of Patent: Aug. 28, 2012

(54) SEMICONDUCTOR DEVICE WITH HOLLOW AND THROUGHHOLE AND METHOD OF MANUFACTURING SAME

(75) Inventors: Kaoru Sonobe, Tokyo (JP); Hidehiro Takeshima, Tokyo (JP); Shinei Sato, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 156 days.

(21) Appl. No.: 12/717,724

(22) Filed: Mar. 4, 2010

(65) Prior Publication Data
US 2010/0244234 A1 Sep. 30, 2010

(30) Foreign Application Priority Data

Mar. 30, 2009 (JP) ................................. 2009-082236

(51) Int. Cl.
*H01L 23/48* (2006.01)
*H01L 21/00* (2006.01)

(52) U.S. Cl. ......................... 257/783; 257/784; 438/118

(58) Field of Classification Search ........................ None
See application file for complete search history.

(56) References Cited

U.S. PATENT DOCUMENTS

| | | | |
|---|---|---|---|
| 6,064,111 A | 5/2000 | Sota et al. | |
| 6,236,108 B1 | 5/2001 | Sota et al. | |
| 6,307,269 B1 | 10/2001 | Akiyama et al. | |
| 6,515,371 B2 | 2/2003 | Akiyama et al. | |
| 6,573,612 B1 | 6/2003 | Miyata | |
| 6,639,323 B2 | 10/2003 | Akiyama et al. | |
| 6,759,745 B2* | 7/2004 | Masumoto et al. | 257/730 |
| 7,091,620 B2 | 8/2006 | Miyazaki et al. | |
| 7,268,018 B2* | 9/2007 | Moxham | 438/118 |
| 7,420,284 B2 | 9/2008 | Miyazaki et al. | |
| 7,799,610 B2* | 9/2010 | Tan et al. | 438/110 |
| 2001/0031515 A1* | 10/2001 | Miyasaka | 438/108 |
| 2003/0207557 A1 | 11/2003 | Akiyama et al. | |
| 2004/0061220 A1 | 4/2004 | Miyazaki et al. | |
| 2005/0035465 A1* | 2/2005 | Miyasaka | 257/778 |
| 2005/0212142 A1 | 9/2005 | Miyazaki et al. | |
| 2007/0108592 A1* | 5/2007 | Lai et al. | 257/700 |
| 2009/0321920 A1* | 12/2009 | Sakurada et al. | 257/698 |
| 2010/0252923 A1* | 10/2010 | Watanabe et al. | 257/737 |

FOREIGN PATENT DOCUMENTS

| | | |
|---|---|---|
| JP | 10-189820 A | 7/1998 |
| JP | 11-87414 A | 3/1999 |
| JP | 2001-044229 A | 2/2001 |

OTHER PUBLICATIONS

Mitsuhisa Watanabe, USPTO Office Action, U.S. Appl. No. 12/726,853, Oct. 21, 2011, 11 pages.

\* cited by examiner

*Primary Examiner* — Alonzo Chambliss
(74) *Attorney, Agent, or Firm* — Foley & Lardner LLP

(57) ABSTRACT

The present invention provides a semiconductor device which includes a semiconductor chip formed with an electrode pad on one surface thereof, a wiring board having a wiring pattern, with its one surface opposing the other surface of the semiconductor chip, a wire for electrically connecting the electrode pad of the semiconductor chip with the wiring pattern of the wiring board, an external terminal arranged on the other surface of the wiring board for electrical connection with the electrode pad through the wire and wiring pattern, and a sealant for fixing the semiconductor chip on one surface of the wiring board such that a hollow is formed between the other surface of the semiconductor chip and the one surface of the wiring board. The wiring board includes a throughhole communicating with the hollow.

14 Claims, 12 Drawing Sheets

SEMICONDUCTOR DEVICE WITH HOLLOW AND THROUGHHOLE AND METHOD OF MANUFACTURING SAME

BACKGROUND OF THE INVENTION

1. Field of the Invention

The present invention relates to a semiconductor device which comprises semiconductor chips mounted on a board, and a method of manufacturing the same.

2. Description of the Related Art

A semiconductor device of a conventional BGA (Ball Grid Array) structure is known, for example, from a structure described in JP2001-044229A (Document 1). This BGA-structured semiconductor device comprises a wiring board. On one surface, the wiring board is formed with a predetermined circuit and is also mounted with a semiconductor chip formed with a plurality of electrode pads. On the other surface of the wiring board, in turn, a plurality of external terminals are arranged in a lattice form, corresponding to the electrode pads on the semiconductor chip. Then, the electrode pads on the semiconductor chip are electrically connected with the external terminals corresponding to the electrode pads through a wiring pattern on the wiring board, and the like. On the one surface of the wiring board, a sealant is formed so as to cover at least the semiconductor chip and electric connections between the semiconductor chip and the wiring board.

Such semiconductor devices that have a conventional BGA structure are manufactured, for example, using a MAP (Mold Array Process) method, by collectively sealing a plurality of semiconductor chips disposed on a wiring board.

A semiconductor device that has a conventional BGA structure comprises a semiconductor chip securely adhered on a wiring board using DAF (Die Attach Film), an adhesive or the like. Then, the semiconductor device undergoes a reflow process, where balls which serve as external terminals of the wiring board are melted, and is bonded to a mounting board so that the semiconductor device is mounted on the mounting board. A semiconductor device is assembled by securely adhering a semiconductor chip, a wiring board and the like which are made of a plurality of types of materials each having different coefficients of thermal expansion.

Accordingly, the entire semiconductor device suffers from warpage due to a rise in temperature of the semiconductor device during a reflow process. As a result, stress is applied to external terminals bonded on a mounting board. This stress causes the external terminals to break, to peel off from the mounting board, and other phenomena. For this reason, the electrically connection in the connected state of the semiconductor device and the mounting board is damaged, possibly resulting in degraded reliability of the semiconductor device.

As an action taken to address the foregoing problem, JP11-087414A (Document 2), for example, proposes a structure which includes an elastic member (elastomer) sandwiched between a semiconductor chip and a wiring board in order to alleviate stress which occurs between the semiconductor chip and the wiring board.

JP10-189820A (Document 3), in turn, discloses a structure for preventing a package of a semiconductor device from cracking. In this structure, a semiconductor chip is mounted, by way of a die bond film, on a board which has a bonding sheet formed with a wiring pattern and throughholes, such that a gap is formed between the die bond film and the bonding sheet to communicate with the through holes.

Then, the present inventors have recognized the following problems.

The elastomer, which is used as an elastic material in the configuration of aforementioned Document 2, is a very expensive material, and therefore causes an increase in the manufacturing cost of semiconductor devices.

On the other hand, in the configuration described in aforementioned Document 3, since a semiconductor chip is directly secured on a board, stress will occur due to the difference in the coefficients of thermal expansion between the semiconductor chip and the board. For this reason, reliability of the semiconductor device can undergo degradation because solder balls, which serve as external terminals, are damaged in a reflow process.

Also, in the configuration described in Document 3, a die bond film is applied on the entire back surface of a semiconductor chip. Thus, if a void occurs between the die bond film and the semiconductor chip, the package is likely to suffer from cracking during the reflow process for solder balls. Further, due to the employment of the die bond film, this configuration can cause an increase in the manufacturing cost of the semiconductor device.

Moreover, in the configuration described in Document 3, a semiconductor chip is bonded only to wiring metal laminated on a bonding sheet which forms part of the board. Therefore, in this configuration, the wiring metal can be broken because stress intensively acts on the wiring metal which is caused by the effect of a thermal history in the reflow process or by the effect of thermal cycling.

SUMMARY

The present invention is intended to solve the problems described above.

In one embodiment, there is provided a semiconductor device that comprises a semiconductor chip formed with an electrode pad on one surface thereof, a wiring board having a wiring pattern, with its one surface opposing the other surface of the semiconductor chip, a connection member for electrically connecting the electrode pad of the semiconductor chip with the wiring pattern of the wiring board, an external terminal arranged on the other surface of the wiring board for electrical connection with the electrode pad through the connection member and the wiring pattern, and a fixing member for fixing the semiconductor chip on the one surface of the wiring board such that a hollow is formed between the other surface of the semiconductor chip and the one surface of the wiring board, wherein the wiring board includes a throughhole that communicates with the hollow.

The semiconductor device of the present invention configured as described above comprises the hollow defined between the other surface of the semiconductor chip and the one surface of the wiring board, thereby reducing the area on which the other surface of the semiconductor chip adheres to the one surface of the wiring board, and restraining the occurrence of warpage caused by the difference in the coefficients of thermal expansion between the semiconductor chip and the wiring board. Also, the hollow communicates with the throughhole of the wiring board. Accordingly, even if air within the hollow expands due to a rise in the temperature of the semiconductor device when the semiconductor device is mounted, the expanded air can be allowed to escape to the outside of the wiring board through the throughhole. As a result, cracking which is caused to occur in the package of semiconductor device by the occurrence of the expanded air within the hollow can be prevented from happening. These advantages improve the reliability of the semiconductor device.

According to the present invention, the semiconductor device can be improved in reliability.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purpose.

First Embodiment

Figure 1:
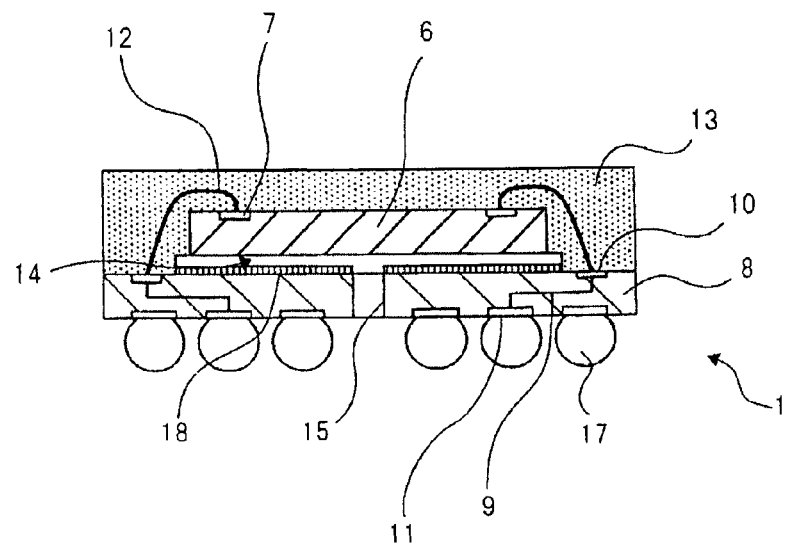
FIG. 1 is a cross-sectional view showing a semiconductor device according to a first embodiment.
Figure 2:
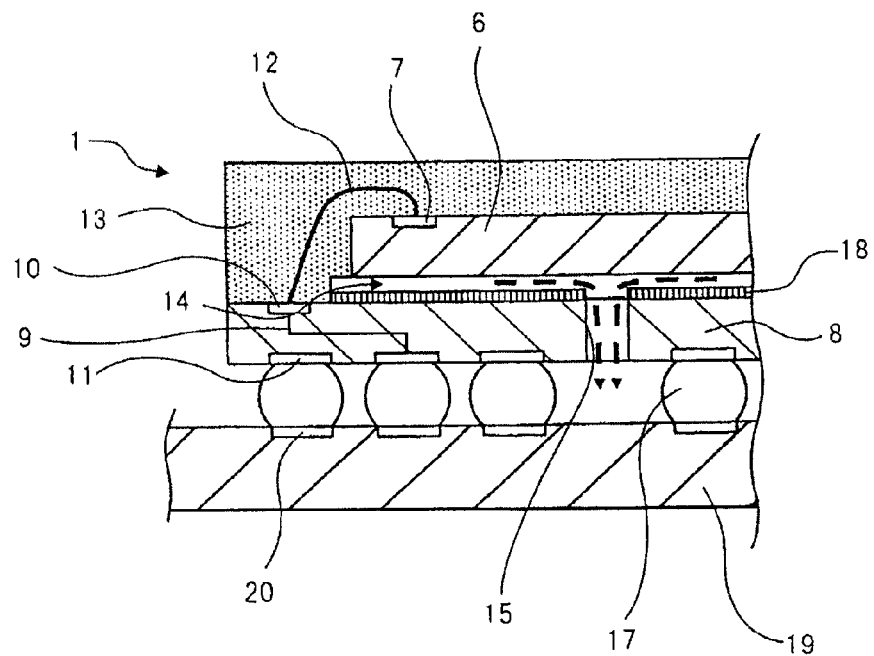
FIG. 2 is a cross-sectional view for describing a hollow and a throughhole in the semiconductor device according to the first embodiment.

FIGS. 1 and 2 are cross-sectional views showing the structure of a semiconductor device according to a first embodiment. The semiconductor device according to the first embodiment is, for example, a semiconductor device that has BGA structure.

As shown in FIGS. 1 and 2, semiconductor device 1 of the first embodiment comprises semiconductor chip 6 which is formed in the shape of a substantially rectangular plate. A predetermined circuit is formed on one main surface (hereinafter called the "front side"), as one surface of semiconductor chip 6. A plurality of electrode pads 7 are also formed, for example, in an outer peripheral zone of the front side of semiconductor chip 6. Also, though not shown, an insulating protective film is formed on the front side of semiconductor chip 6 except in the area of electrode pads 7, such that the protective film protects the circuit formation surface of semiconductor chip 6.

Also, below the other main surface of semiconductor chip 6 (hereinafter called the "back side") as the other surface, wiring board 8 is disposed. Wiring board 8 is formed with predetermined wiring pattern 9 as conducting means. Wiring board 8 employed herein is a laminate board which is formed in the shape of a substantially rectangular plate and is made of an insulating material, for example, glass epoxy or the like. Wiring board 8 is formed with a semiconductor chip mounting area on one main surface thereof (hereinafter called the "front side") as one surface. This semiconductor chip mounting area is formed with a plurality of connection pads 10 in an outer peripheral zone thereof as connections corresponding to electrode pads 7 of semiconductor chip 6 mounted on wiring board 8. A plurality of lands 11 are formed on the other main surface (hereinafter called the "back side") of wiring board 8 as the other surface.

Electrode pads 7 of semiconductor chip 6 are connected with connection pads 10 of wiring board 8 corresponding to electrode pads 7 through wires 12 as connection members made of a conductive material, for example, Au or the like. In this way, electrode pads 7 of semiconductor chip 6 are electrically connected with lands 11 corresponding to electrode pads 7 through wiring pattern 9 on wiring board 8.

Wiring board 8 is formed with sealant 13 on the front side as a fixing member made of a thermosetting resin such as epoxy resin. Sealant 13 is formed to cover at least the front side of semiconductor chip 6 and wires 12 for electrically connecting wiring board 8 with semiconductor chip 6. Since sealant 13 is formed by a MAP method, later described, sealant 13 is formed such that the side surfaces of wiring board 8 are flush with the side surfaces of sealant 13.

Also, hollow 14 is defined between the back side of semiconductor chip 6 and the front side of wiring board 8. Accordingly, the front side of wiring board 8 is spaced apart from and in the face of the back side of semiconductor chip 6 across hollow 14. This hollow 14 serves as a stress alleviation layer for alleviating stress which can occur between semiconductor chip 6 and wiring board 8. More specifically, semiconductor device 1 is configured to effectively prevent stress acting on semiconductor chip 6 or wiring board 8 from being transmitted through the back side of semiconductor chip 6 by including hollow 14.

As shown in FIG. 2, hollow 14 is defined, for example, at a position adjacent to the back side of semiconductor chip 6, and is preferably formed to have a size larger than the size of the back side of semiconductor chip 6, i.e., the area of the back side or more. According to this configuration, the entire back side of semiconductor chip 6 is set apart from the front side of wiring board 8 by hollow 14. Thus, when the temperature of semiconductor device 1 rises, for example, in a reflow process for mounting, stress can be more effectively alleviated, when generated between semiconductor chip 6 and wiring board 8.

Further, throughhole 15 is formed through wiring board 8 within the semiconductor chip mounting area. Throughhole 15 is positioned at one site, for example, at the center of the semiconductor chip mounting area, and is in communication with hollow 14. Stated another way, hollow 14 is formed to continue to the back side of wiring board 8 through throughhole 15. Because throughhole 15 communicates with hollow 14, air within hollow 14 is smoothly discharged to the outside from throughhole 15 even if the temperature of semiconductor device 1 rises to cause the air to expand within hollow 14. Consequently, a crack in the package of semiconductor device 1 can be prevented.

Notably, throughhole 15 is only required to be in communication with hollow 14, and may therefore be formed at another position of wiring board 8. Alternatively, a plurality of throughholes 15 may be formed in another configuration. Further, throughhole 15 may vary, as required, with respect to the diameter, the shape of the opening, and the like. However, foreign substances may possibly intrude into hollow 14 from throughhole 15. Accordingly, throughhole 15 can have a larger effect in preventing foreign substances from intruding into hollow 14, when it is formed to have an opening of a relatively small area, or when it is formed to bend in the middle in the depth direction. Also, for preventing foreign substances from intruding into hollow 14, an air-permeable sheet member may be employed and applied over the opening of throughhole 15 on the back side of wiring board 8.

Further, a plurality of lands 11 are arranged in a lattice form on the back side of wiring board 8. As such, throughhole 15 is advantageously positioned in a central region of wiring board 8, for example, at the center of the semiconductor chip mounting area because throughhole 15 thus positioned will not prevent routing of wiring pattern 9, and permits a larger number of connection pads 10 to be arranged on wiring board 8.

Also, a plurality of external terminals 17 are formed on lands 11 of wiring board 8. A ball made of a conductive material, for example, solder or the like is mounted on land 11 through flux, and a reflow process is performed to melt the balls so that external terminal 17 is formed on land 11 with the ball.

Also, as shown in FIG. 1, adhesive member 18 is applied on the front side of wiring board 8 except for throughhole 15 within hollow 14. Adhesive member 18 employed herein is a material which keeps a predetermined adhesive strength, for example, at temperatures up to approximately 160° C., and melts or thermally contract at temperatures equal to or higher than 200° C. Adhesive member 18 is made, for example, of a film material which contains cyclic olefin-based resin blended with epoxy-based resin so as to achieve predetermined characteristics. By heating adhesive member 18 to 200° C. or higher after the formation of sealant 13, adhesive member 18 thermally contracts to form hollow 14.

Semiconductor device 1 configured as described above undergoes a reflow process, when it is mounted, where external terminals 17 are melted, and as shown in FIG. 2, semiconductor device 1 is mounted with a plurality of external terminals 17 connected to a plurality of lands 20 on mounting board 19, respectively.

In this way, the semiconductor device according to this embodiment comprises semiconductor chip 6 having electrode pads 7 formed on the front side (one surface); wiring board 8 having wiring pattern 9 with its one surface (front side) opposing the back side (the other surface) of semiconductor chip 6; wires 12 (connection members) for electrically connecting electrode pads 7 of semiconductor chip 6 with wiring pattern 9 of wiring board 8; external terminals 17 disposed on the back side (the other surface) of wiring board 8 and electrically connected to electrode pads 7 through wires 12 (connection members) and wiring pattern 9; and sealant 13 (fixing member) for fixing semiconductor chip 6 on the front side (one surface) of wiring board 8 such that hollow 14 is formed between the back side (the other surface) of semiconductor chip 6 and the front side (one surface) of wiring board 8. Wiring board 8 also comprises throughhole 15 in communication with hollow 14.

Since this configuration reduces the area on which the back side of semiconductor chip 6 adheres to the front side of wiring board 8, it is possible to prevent warpage from occurring due to the difference in the coefficients of thermal expansion between semiconductor chip 6 and wiring board 8. Also, hollow 14 is in communication with throughhole 15 of wiring board 8. Therefore, when air within hollow 14 expands due to a rise in temperature of semiconductor device 1 in a ball attachment reflow process or a reflow process for mounting semiconductor device 1, the expanded air can be allowed to escape from throughhole 15 to the outside of wiring board 8, thus making it possible to prevent cracking from occurring in the package of semiconductor device 1.

According to the foregoing configuration, the reliability of semiconductor device 1 in preventing stress from being transferred to semiconductor chips can be improved. Also, since this embodiment does not employ any expensive material such as elastomer, this embodiment can alleviate stress occurring between semiconductor chip 6 and wiring board 8 at a relatively low cost.

(Method of Manufacturing Semiconductor Device According to First Embodiment)

Next, a method of manufacturing the semiconductor device according to the first embodiment will be described with reference to FIG. 3.

First, a semiconductor wafer for use in the method of manufacturing the semiconductor device is provided by forming a silicon ingot, for example, by a single-crystal pull-up method, slicing the silicon ingot into discoidal substrates, and forming a desired circuit and electrode pads 7 on the front side of a substrate through several processes such as diffusion.

Though not shown, the semiconductor wafer is transferred to a dicing unit to undergo the dicing process. In the dicing process, the semiconductor wafer is securely adhered to a UV tape that is provided with an adhesive material which characteristically exhibits adhesive strength that becomes lower when it is irradiated with ultraviolet (UV) rays. In this state, the semiconductor wafer is ground along dicing areas positioned between adjacent semiconductor chips 6, and diced into individual semiconductor chips 6 by a dicing blade which rotates at high speeds. After dicing, the UV tape is irradiated with UV rays to reduce the adhesive strength of the UV tape. In this state, semiconductor chips 6 are pushed up from below the UV tape to peel off semiconductor chips 6 from the UV tape, and semiconductor chips 6 are picked up. In this way, semiconductor chips 6 are produced, each with a plurality of electrode pads 7 formed on the front side.

Also, wiring board 8 for use in this embodiment is processed by a MAP method, where a unit pattern is created in the following manner.

The unit pattern of wiring board 8, i.e., one wiring board 8 which forms part of semiconductor device 1, is in a substantially rectangular shape, by way of example. A semiconductor chip mounting area is formed in a substantially central area on the front side of wiring board 8. A plurality of connection pads 10 are arranged in an outer peripheral zone of the semiconductor chip mounting area. Connection pads 10 are formed in correspondence to electrode pads 7 of semiconductor chip 6 which is to be mounted on wiring board 8. Also, a plurality of lands 11 are arranged on the back side of wiring board 8. Lands 11 correspond to electrode pads 7 of semiconductor chip 6, and are electrically connected with connection pads 10 through wiring pattern 9. Lands 11 are arranged, for example, at predetermined intervals in a lattice form. Throughhole 15 is also pierced substantially at the center of semiconductor chip mounting area on wiring board 8, extending therethrough from the front side to the back side.

Figure 3:
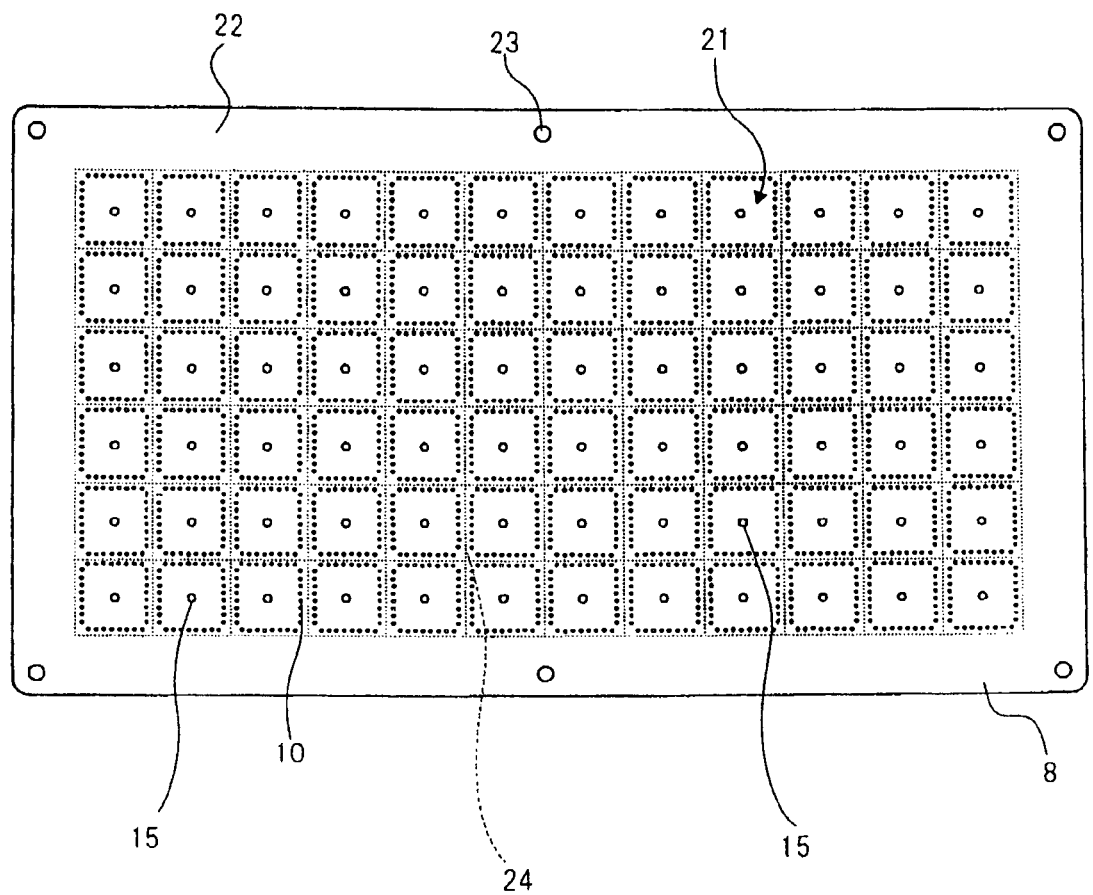
FIG. 3 is a top plan view for describing a method of manufacturing the semiconductor device according to the first embodiment.

Though not particularly limited, in the configuration of the board shown in FIG. 3, the unit patterns of wiring board 8 are arranged in a matrix of six rows and 12 columns. Therefore, a plurality of product formation areas 21, each having one unit pattern, are arrayed on the board, as shown in FIG. 3. Frame 22 having a predetermined width is formed around the periphery of the board on which a plurality of product formation areas 21 are arrayed. Frame 22 comprises a plurality of guide holes 23 which enable transportation and positioning of the board. Dicing lines 24 are drawn along boundaries of each unit pattern on wiring board 8. Thus, the board is prepared, as configured as shown in FIG. 3.

As shown in FIGS. 4A-4F, the semiconductor chip mounting area of wiring board 8 is provided with adhesive member 18 which is made, for example, of a cyclic olefin-based resin material blended with epoxy-based resin so as to achieve predetermined characteristics. A material used for adhesive member 18 is a non-conductive material which maintains a predetermined adhesive strength at temperatures, for example, up to approximately 160° C., and melts or contracts at temperatures equal to or higher than 200° C. Also, adhesive member 18 is adhered to the semiconductor chip mounting area so as not to cover throughhole 15. The size of adhesive member 18 is arranged so that it has an area equal to or larger than the area of the back side of semiconductor chip 6 to be mounted. In this way, when adhesive member 18 melts or contracts in a process, later described, the entire area of the back side of semiconductor chip 6 can be spaced apart from the front side of wiring board 8. Alternatively, adhesive member 18 may be attached on the back side of semiconductor chip 6 instead of the front side of wiring board 8.

Wiring board 8 to which adhesive member 18 has been attached is transferred to a die bonding unit to undergo the die bonding process. In the die bonding process, semiconductor chips 6 are mounted respectively in the areas of a plurality of semiconductor chip mounting areas laid out in a matrix form on wiring board 8. Semiconductor chip 6 is mounted on wiring board 8 by adhering the back side of semiconductor chip 6 to adhesive member 18 attached to the semiconductor chip mounting area. In this event, the opening of throughhole 15 on the front side of wiring board 8 is covered with adhesive member 18 and the back side of semiconductor chip 6.

Figure 4A:
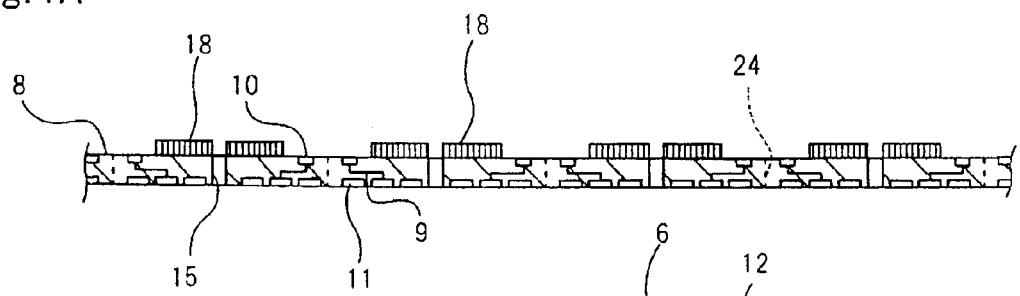
FIGS. 4A-4F are cross-sectional views for describing a method of manufacturing the semiconductor device according to the first embodiment.
Figure 4B:
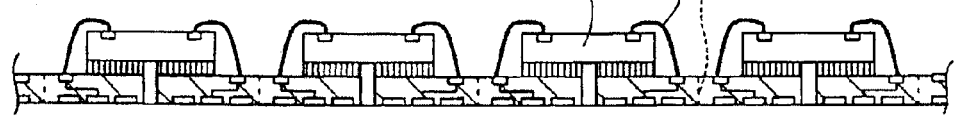
Figure 5:
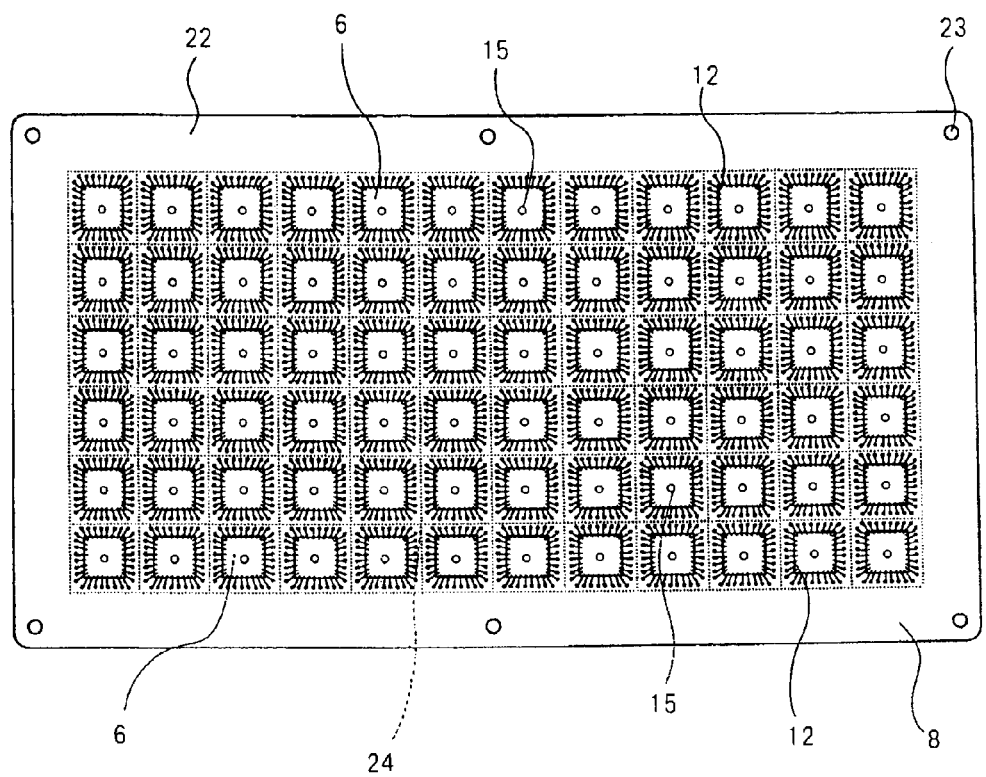
FIG. 5 is a top plan view showing a wire bonding process in the method of manufacturing the semiconductor device according to the first embodiment.

Wiring board 8 mounted with semiconductor chips 6 is transferred to a wire bonding unit to undergo the wire bonding process. In the wire bonding process, electrode pads 7 of semiconductor chips 6 mounted on wiring board 8 are electrically connected with connection pads 10 disposed in the outer peripheral zone of wiring board 8, on which semiconductor chip 6 is mounted, using wires 12 which are made of a conductive material, for example, Au or the like. In this way, electrode pads 7 of semiconductor chip 6 are electrically connected with lands 11 corresponding to electrode pads 7 through wires 12 and wiring pattern 9 of wiring board 8. The wire bonding involves ultrasonic thermocompression bonding of one end of wire 12, melted to form a ball, to electrode pad 7 of semiconductor chip 6, using a wire bonding machine, not shown, to connect wire 12 to electrode pad 7. Subsequently, wire 12 is guided to draw a predetermined loop shape, and the other end of wire 12 is connected onto connection pad 10 corresponding to electrode pad 7 through ultrasonic thermocompression bonding. The connection of the other end of wire 12 is followed by cutting a surplus portion of wire 12 extending from this other end. In this way, all of a plurality of electrode pads 7 included in semiconductor chip 6 are wire bonded to all of a plurality of connection pads 10 included in wiring board 8, to complete the structure as shown in FIGS. 4B and 5. Notably, since the wire bonding is performed at temperatures of approximately 150° C., by way of example, adhesive member 18 maintains a predetermined adhesive strength in the wire bonding process. Thus, semiconductor chips 6 are securely held by adhesive member 18, so that wire bonding processing can be accomplished in a satisfactory manner.

Figure 4C:
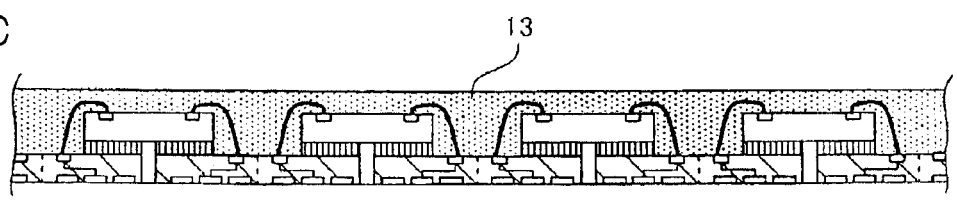
Figure 6:
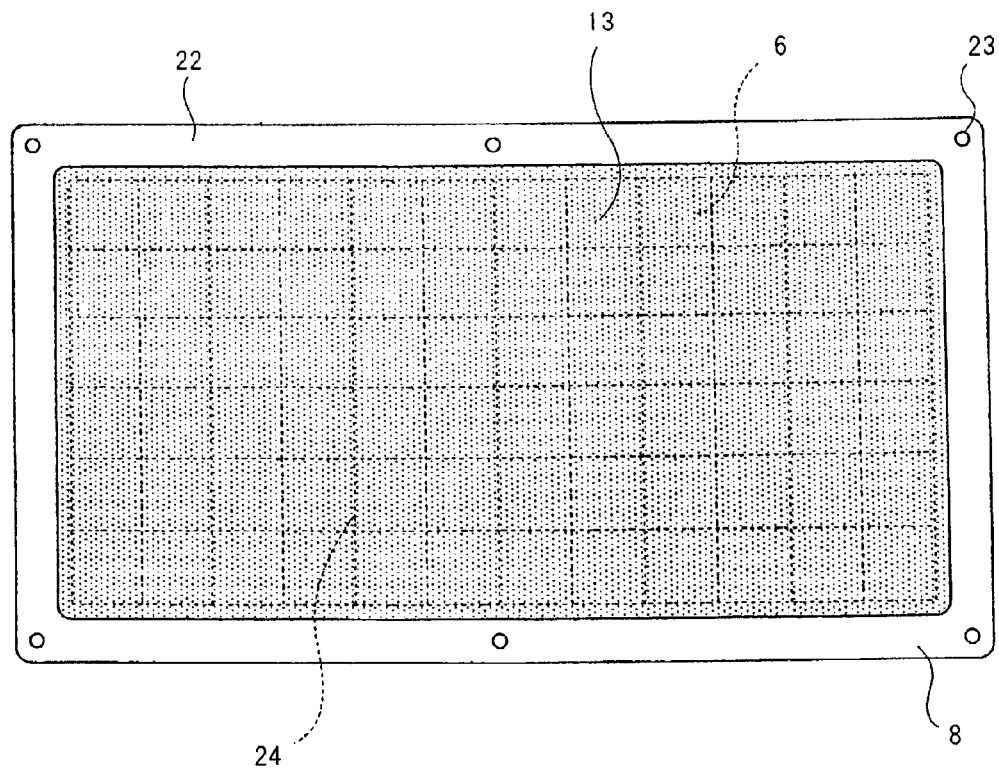
FIG. 6 is a top plan view showing a resin sealing process in the method of manufacturing the semiconductor device according to the first embodiment.

After the completion of wire bonding, resulting wiring board 8 is transferred to a resin sealing process. In the resin sealing process, a plurality of product formation areas 21 arrayed in a matrix form are collectively sealed with a thermosetting resin such as epoxy resin to form sealant 13 on the front side of wiring board 8 so as to cover at least the front side of semiconductor chip 6 and wires 12, as shown in FIGS. 4C and 6. In such a resin sealing process, wiring board 8 is clamped using a mold comprised of an upper piece and a lower piece, for example, included in a transfer mold machine, not shown, an epoxy resin is injected into a cavity defined by the upper piece and lower piece from a gate of the mold, and the resin is thermally cured to form sealant 13. In this event, the opening of throughhole 15 that is pierced through wiring board 8, on the front side of wiring board 8, is covered with adhesive member 18 and the back side of semiconductor chip 6, as shown in FIG. 4B, such that the resin for forming sealant 13 is prevented from flowing into throughhole 15.

Figure 4D:
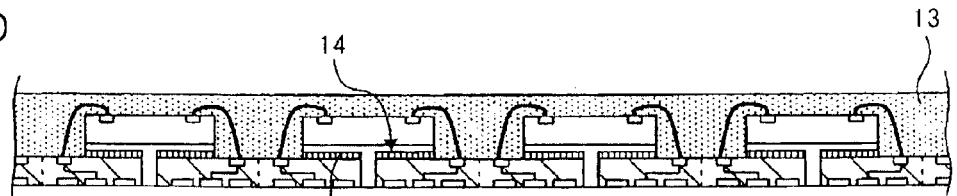

Next, wiring board 8 formed with sealant 13 is transferred to a hollow formation process. In the hollow formation process, wiring board 8 formed with sealant 13 is subjected to a ball attachment reflow process to heat wiring board 8 to temperatures equal to or higher than 200° C., such that adhesive member 18 is thermally contracted, allowing adhesive member 18 to peel off from the back side of semiconductor chip 6, as shown in FIG. 4D. Notably, while the ball attachment reflow process additionally serves as the hollow formation process in this embodiment, the hollow formation process, which involves heating wiring board 8 formed with sealant 13 at temperatures equal to or higher than 200° C., may be independent of the ball attachment reflow process. Then, adhesive member 18 peels off from the back side of semiconductor chip 6, resulting in the formation of hollow 14, which adjoins the back side of semiconductor chip 6, between the back side of semiconductor chip 6 and the front side of wiring board 8. This hollow 14 serves as a stress alleviation layer between semiconductor chip 6 and wiring board 8.

Figure 7:
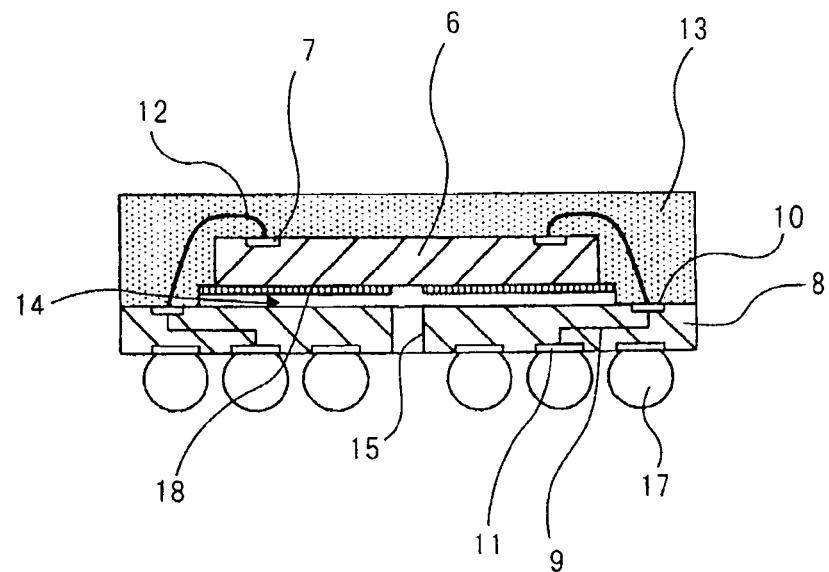
FIG. 7 is a cross-sectional view showing another configuration of the semiconductor device according to the first embodiment.
Figure 8:
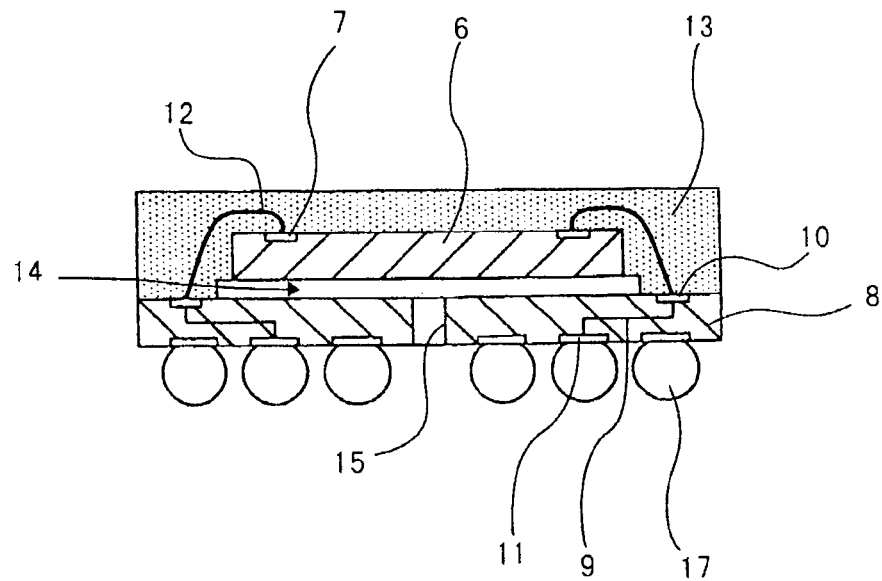
FIG. 8 is a cross-sectional view showing a further configuration of the semiconductor device according to the first embodiment.

Notably, hollow 14 is only required to be formed between the back side of semiconductor chip 6 and the front side of wiring board 8. Accordingly, thermally contracted adhesive member 18 may remain on the back side of semiconductor chip 6, for example, as shown in FIG. 7. Alternatively, adhesive member 18 may be made using a material which melts or evaporates at a predetermined temperature, so that the overall adhesive member is discharged through throughhole 15 to the outside, with the result that any adhesive member will not remain within hollow 14, as shown in FIG. 8. Further alternatively, adhesive member 18 may be made using a material which significantly degrades the adhesive strength with semiconductor chip 6 or the adhesive strength with wiring board 8 at temperatures equal to or higher than 200° C., so that hollow 14 is formed as a result between the back side of semiconductor chip 6 and the front surface of wiring board 8.

Also, hollow 14 is in communication with throughhole 15 which extends through wiring board 8 from the front side to the back side. Thus, even if semiconductor device 1 is heated when it is mounted, expanded air within hollow 14 is discharged to the outside from throughhole 15, thus making it possible to prevent a crack from occurring in the package of semiconductor device 1. In this regard, the back side of semiconductor chip 6 is completely spaced apart from the front side of wiring board 8 when the size of hollow 14 is arranged such that its area in a direction parallel to the back side of semiconductor chip 6 is equal to or larger than the size or area of the back side of semiconductor chip 6. By thus configuring hollow 14, the preventing of stress can be ensured from occurring between the back side of semiconductor chip 6 and the front side of wiring board 8. Therefore, such hollow 14 is desired.

Figure 4E:
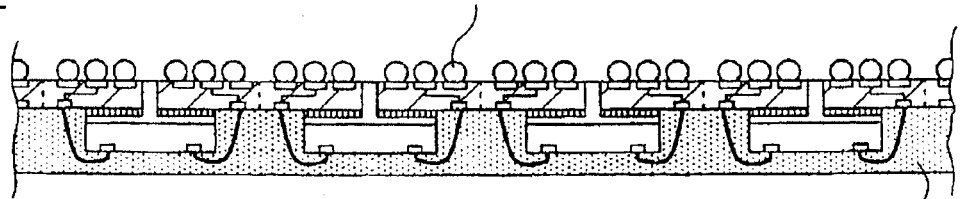

Next, wiring board 8 formed with hollow 14 between semiconductor chip 6 and wiring board 8 is transferred to a ball mount unit to undergo the ball mount process. In the ball mount process, conductive balls are mounted on a plurality of lands 11 arranged on the back side of wiring board 8 in a lattice form, as shown in FIG. 4E, to form external terminals 17 in the form of the balls. In the ball mount process, using an adsorption mechanism, not shown, formed with a plurality of adsorption holes in conformity to the arrangement of lands 11 on wiring board 8, balls made, for example, of solder or the like are held in the adsorption holes. Then, flux is transferred to and formed on the ball held in the adsorption holes of the adsorption mechanism, and the balls are collectively mounted on a plurality of lands 11 on wiring board 8. After mounting the balls, external terminals 17 are formed by performing a ball attachment reflow process.

Figure 4F:
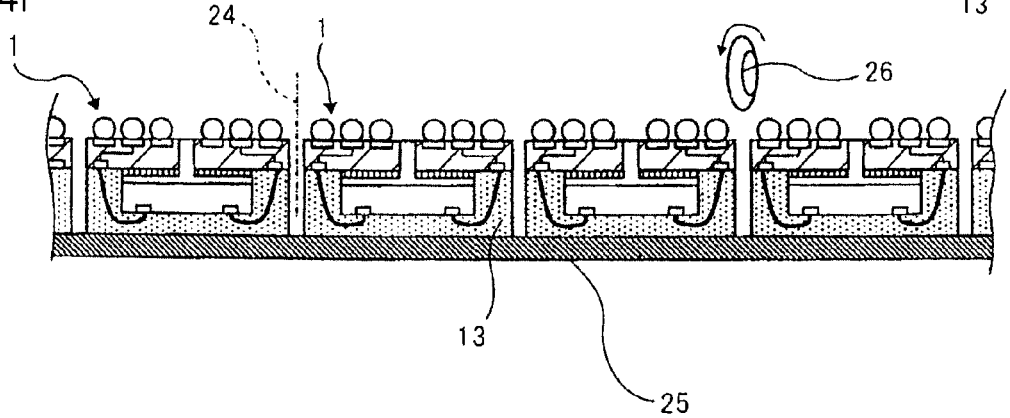

Next, wiring board 8 formed with external terminals 17 is transferred to a board dicing unit to undergo the board dicing process. In the board dicing process, wiring board 8 is cut and separated along dicing lines 24, as shown in FIG. 4F. In the board dicing process, sealant 13 of wiring board 8 is adhered to dicing tape 24 to support wiring board 8 with dicing tape 25. Wiring board 8 is cut vertically and horizontally along dicing lines 24 by dicing blade 26 to singulate wiring board 8. While wiring board 8 is cut by full cut dicing in this embodiment, each of singulated semiconductor chip 1 is supported by dicing tape 25. After the completion of dicing, each singulated semiconductor devices 1 are picked up from dicing tape 25 to provide semiconductor devices 1 as shown in FIG. 1. Notably, since wiring boards 8 that are collectively sealed using the MAP method are cut and separated through dicing, semiconductor device 1 is formed such that the side surfaces of wiring boards 8 are flush with the side surfaces of sealant 13, resulting in a satisfactory hexahedral structure.

As described above, the manufacturing method according to this embodiment comprises the steps of providing a semiconductor chip including a plurality of electrode pads 7 arranged on the front side (one surface) thereof; and providing wiring board 8 including wiring pattern 9, a semiconductor chip mounting area defined on the front side (one surface), throughhole 15 pierced within the semiconductor chip mounting area, and a plurality of lands 11 arranged on the back side (other surface) thereof. The manufacturing method according to this embodiment also comprises the steps of securely adhering the other surface of semiconductor chip 6 to the semiconductor chip mounting area of wiring board 8 with adhesive member 18 such that throughhole 15 is not covered with adhesive member 18; electrically connecting electrode pads 7 of semiconductor chip 6 with wiring pattern 9 through wires 12 (connection members); and forming sealant 13 (fixing member) so as to fix the semiconductor chip on the front side (one surface) of the wiring board. The manufacturing method according to this embodiment further comprises the steps of forming hollow 14 between the back side (other surface) of semiconductor chip 6 and the front side (one surface) of wiring board 8 by contracting or causing a phase change of adhesive member 18 which securely adheres semiconductor chip 6 on wiring board 8, after the formation of sealant 13 (fixing member); and mounting conductive balls on lands 11 of wiring board 8 to form a plurality of external terminals 17. With each of these steps, semiconductor device 1 is provided with hollow 14 formed between the back side (other surface) of semiconductor chip 6 and the front side (one surface) of wiring board 8.

According to the manufacturing method of this embodiment, semiconductor device 1, having improved reliability in preventing stress from being transferred to semiconductor chips, can be manufactured at a relatively low cost by alleviating stress that acts on semiconductor chip 6 or wiring board 8 by the action of hollow 14 without using a relatively expensive elastic material such as elastomer.

Next, other embodiments will be described with reference to the drawings. In other embodiments, the same component members as those of the first embodiment are designated the same reference numerals, and descriptions thereon are omitted.

Second Embodiment

Figure 9:
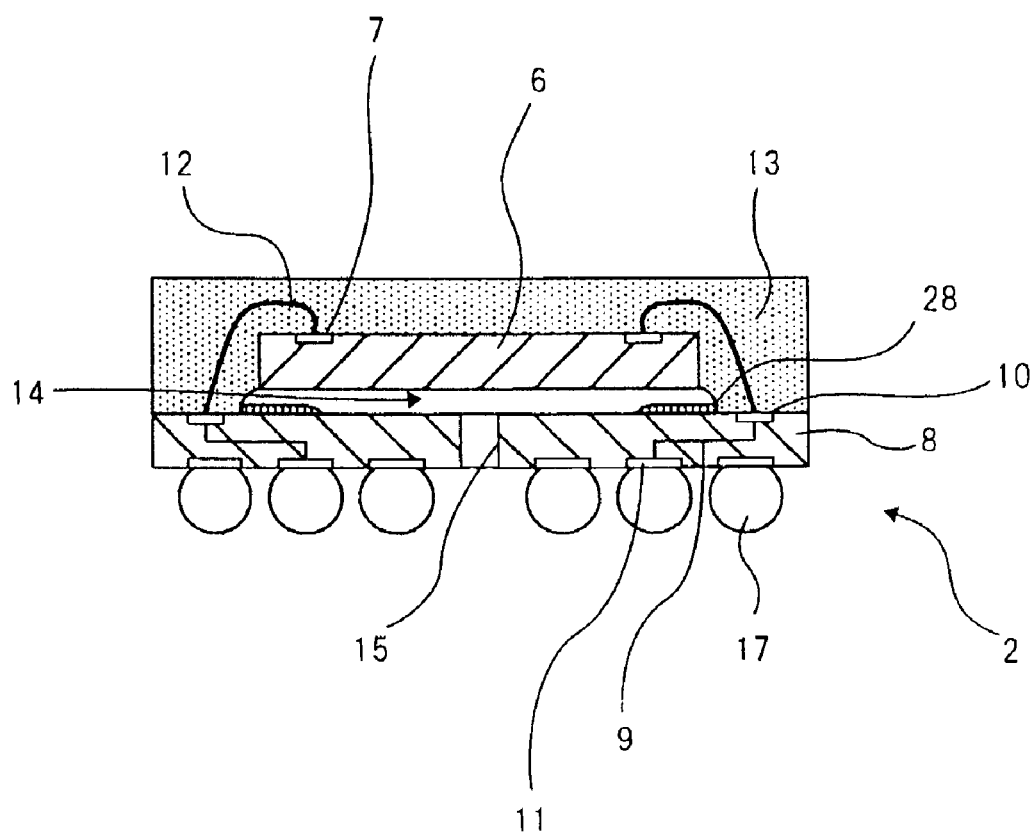
FIG. 9 is a cross-sectional view showing a semiconductor device according to a second embodiment.

Next, a second embodiment will be described with reference to FIGS. 9 and 10A-10E. FIG. 9 is a cross-sectional view showing the structure of a semiconductor device according to the second embodiment, and FIGS. 10A-10E are cross-sectional views showing processes for manufacturing the semiconductor according to the second embodiment.

As shown in FIG. 9, semiconductor device 2 according to the second embodiment is configured substantially in a similar manner to the first embodiment, except for different adhesive member 28 for securing semiconductor chips 6 to wiring board 8. A description will be given of the configuration of semiconductor device 2 according to the second embodiment, and a method of manufacturing the same.

Figure 10A:
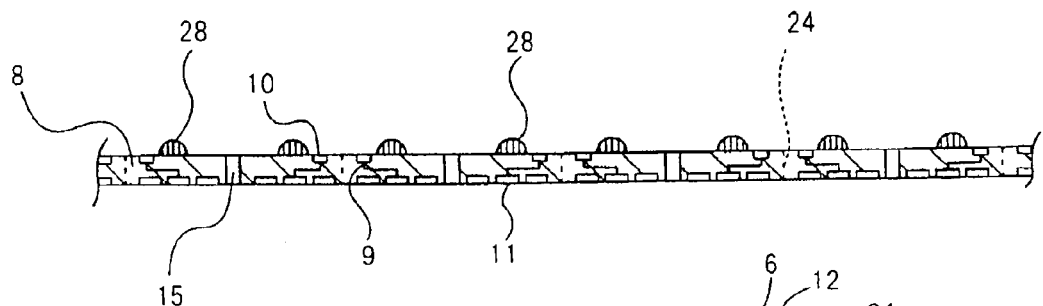
FIGS. 10A-10E are cross-sectional views for describing a method of manufacturing the semiconductor device according to the second embodiment.

As shown in FIG. 10A, insulating adhesive members 28 are arranged in a rectangular frame form along the outer periphery of a semiconductor chip mounting area on wiring board 8. Insulating adhesive members 28 are formed on wiring board 8 in a hemispherical shape, when viewed in cross section, for example, by potting process, and are arranged only in regions along the outer periphery of the semiconductor chip mounting areas on wiring board 8.

Figure 10B:
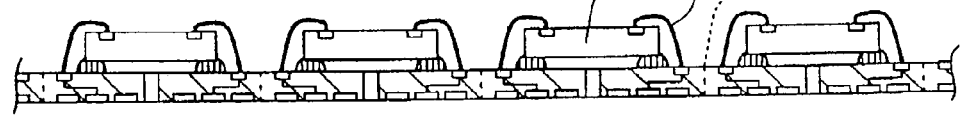
Figure 10C:
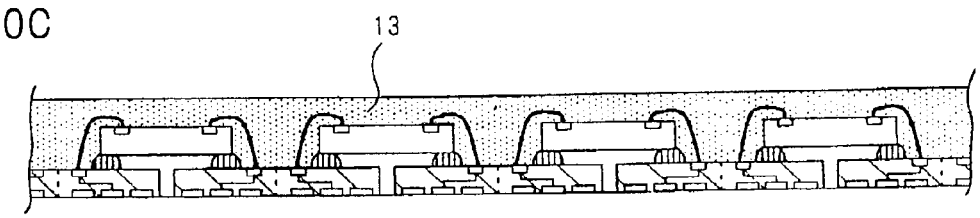

After wiring board 8 is formed with adhesive members 28, semiconductor chips 6 are mounted on adhesive members 28, as shown in FIG. 10B, and electrode pads 7 of semiconductor chip 6 are electrically connected with wiring board 8 through conductive wires 12. Next, after the completion of wire bonding, sealant 13 is formed on the front side of wiring board 8 to cover at least the front side of semiconductor chip 6 and connection pads 10 for electrically connecting wires 12 with wiring board 8, as shown in FIG. 10C.

After the formation of sealant 13, wiring board 8 is heated to approximately 200° C. This heating results in the melting of adhesive members 28 of hemispherical shape in cross-section, which have held semiconductor chips 6, so that adhesive members 28 collapse into a flat shape. As a result, hollow 14 is formed between the back side of semiconductor chip 6 and the front side of wiring board 8, as shown in FIG. 10D.

Figure 10D:
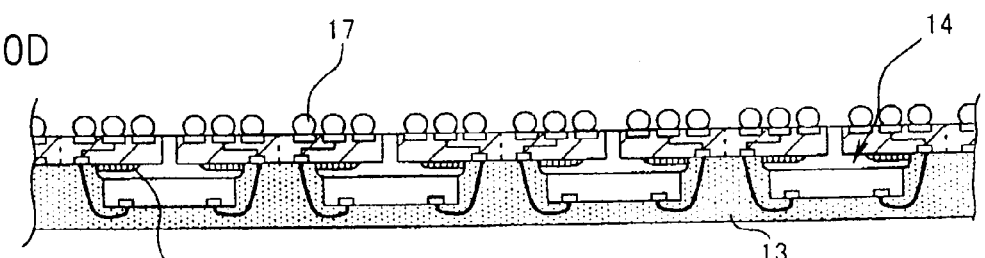
Figure 10E:
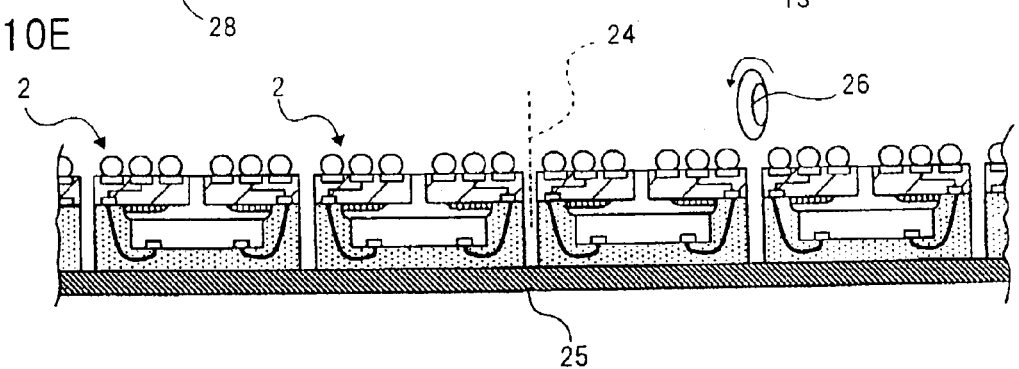

Subsequently, semiconductor device 2 is provided, as shown in FIG. 9, through a ball mount process, a board dicing process, and the like, as shown in FIGS. 10D and 10E. According to this embodiment, hollow 14 has corners formed in an arcuate shape, as viewed in cross section, in boundary zones of the back side of semiconductor chip 6 with sealant 13, so that no angular corners are formed in the boundary zones. According to this embodiment, the reliability of semiconductor device 2 in preventing the transmission of stress can be further improved because stress can be prevented from concentrating on corners.

Third Embodiment

Figure 11:
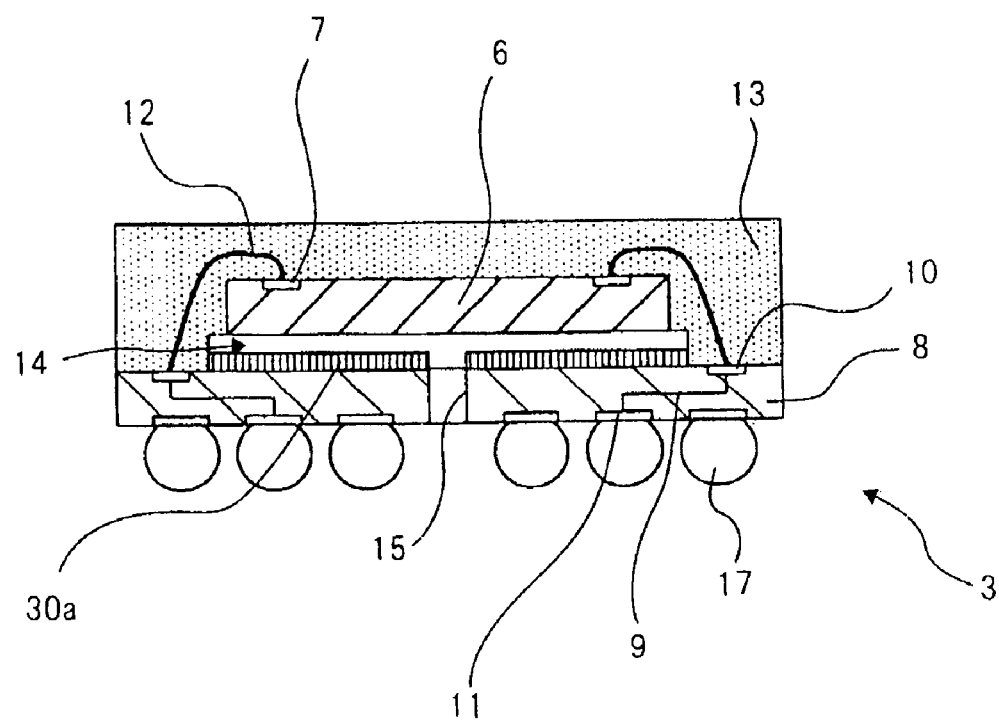
FIG. 11 is a cross-sectional view showing a semiconductor device according to a third embodiment.

Next, a third embodiment will be described with reference to FIGS. 11 and 12A-12F. FIG. 11 is a cross-sectional view showing the structure of a semiconductor device according to the third embodiment. FIGS. 12A-12F are cross-sectional views showing processes of manufacturing the semiconductor device according to the third embodiment.

As shown in FIGS. 11 and 12A-12F, semiconductor device 3 according to the third embodiment is configured substantially in a similar manner to the first embodiment, except for different composition of DAF material 30 as an adhesive member. A description will be given of the configuration of semiconductor device 3 according to the third embodiment, and a method of manufacturing the same.

Figure 12A:
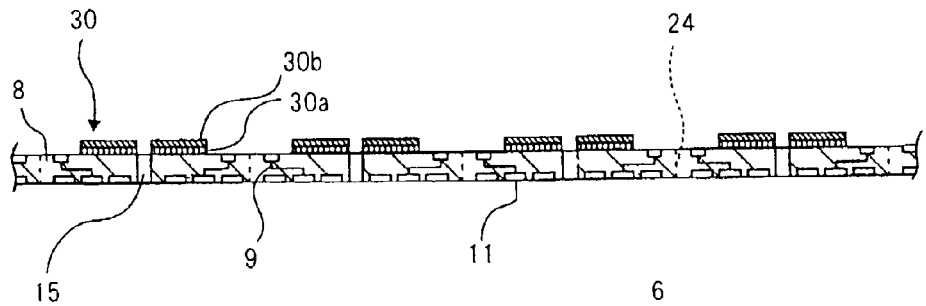
FIGS. 12A-12F are cross-sectional views for describing a method of manufacturing the semiconductor device according to the third embodiment.

As shown in FIG. 12A, insulating DAF materials 30 are arranged on semiconductor chip mounting areas of wiring board 8 so as to surround throughholes 15. DAF material 30 is comprised of a plurality of laminated layers. DAF material 30 comprises at least first adhesive layer 30a made of a general adhesive; and a second evaporizable adhesive layer 30b laminated on first adhesive layer 30a. A cyclic olefin-based resin, for example, is used for second adhesive layer 30b.

Figure 12B:
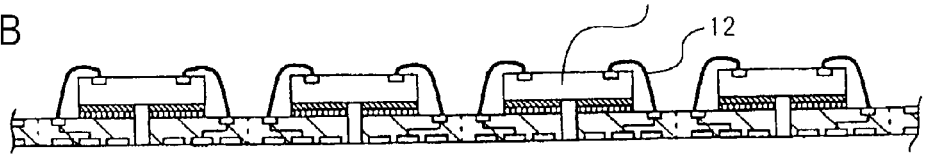
Figure 12C:
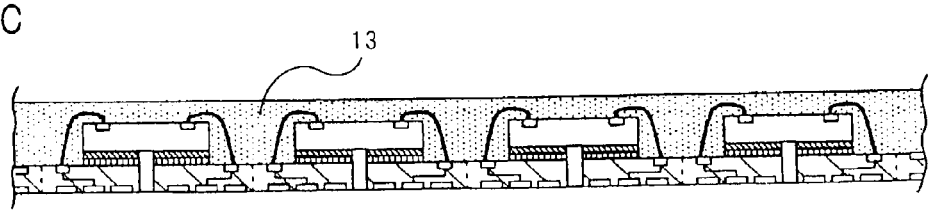

After forming DAF materials 30 on wiring board 8, semiconductor chip 6 is mounted on second evaporizable adhesive layer 30b, and electrode pads 7 of semiconductor chip 6 are electrically connected with wiring board 8 through conductive wire 12, as shown in FIG. 12B. Next, after the completion of wire bonding, sealant 13 is formed on the front side of wiring board 8 so as to cover at least the surfaces of semiconductor chips 6, and connection pads 10 for electrically connecting wires 12 with wiring board 8, as shown in FIG. 12C.

Figure 12D:
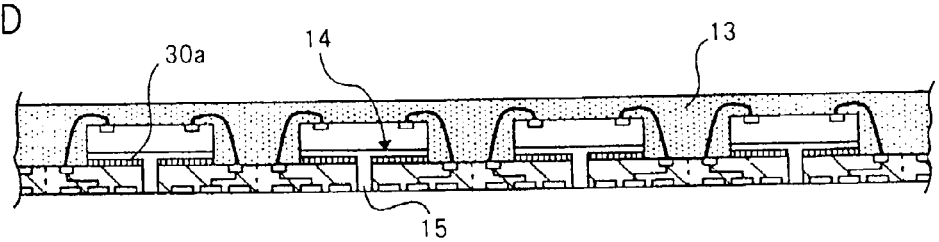

After the formation of sealant 13, wiring board 8 is heated to 200° C. or higher. This heating results in evaporation of second adhesive layer 30b which has held semiconductor chips 6, so that second adhesive layer 30b is discharged through throughhole 15 to the outside of wiring board 8. As a result, hollow 14 is formed between the back side of semiconductor chip 6 and the front side of wiring board 8, as shown in FIG. 12D.

Figure 12E:
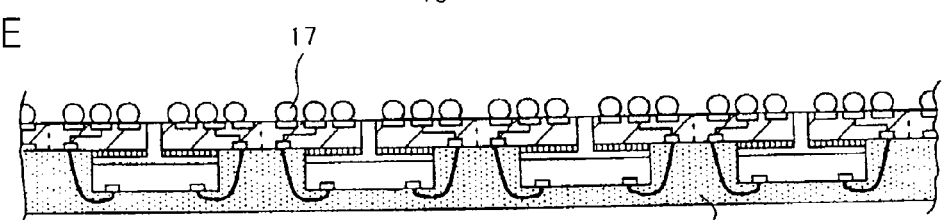
Figure 12F:
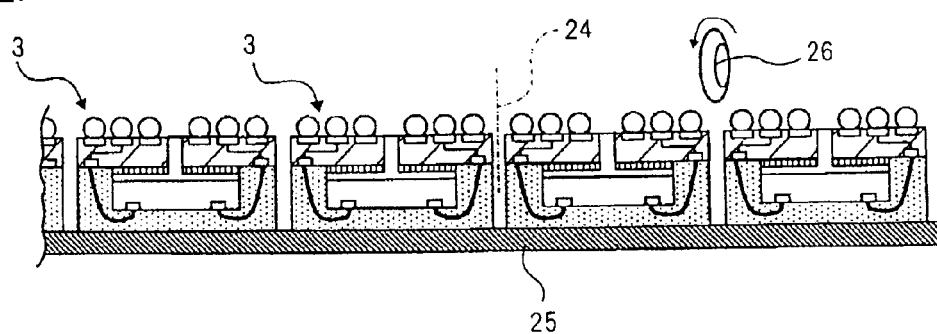

Subsequently, semiconductor device 3 is provided, as shown in FIG. 11, through a ball mount process, a board dicing process, and the like, as shown in FIGS. 12E and 12F. According to this embodiment, this hollow 14 serves as a stress alleviation layer between semiconductor chip 6 and wiring board 8. By thus evaporating second adhesive layer 30b, hollow 14 can be formed without fail between the back side of semiconductor device 6 and the front side of wiring board 8.

While the present invention has been specifically described with reference to embodiments thereof, it should be understood that the present invention is not limited to the foregoing embodiments and can be modified in various manner without departing from the spirit thereof. For example, while the foregoing embodiments have been described in connection with the configuration where a plurality of electrode pads are arranged in an outer peripheral zone on the front side of semiconductor chip 6, the present invention can also be applied to semiconductor chips which differ in the arrangement of electrode pads, such as a center-pad configuration which comprises electrode pads arranged in a central area on the front side of a semiconductor chip.

Also, while the embodiments have been described in connection with a semiconductor device having a BGA structure to which the present invention is applied, the present invention can also be applied to a semiconductor device having a LGA (Land Grid Array) structure.

Figure 13:
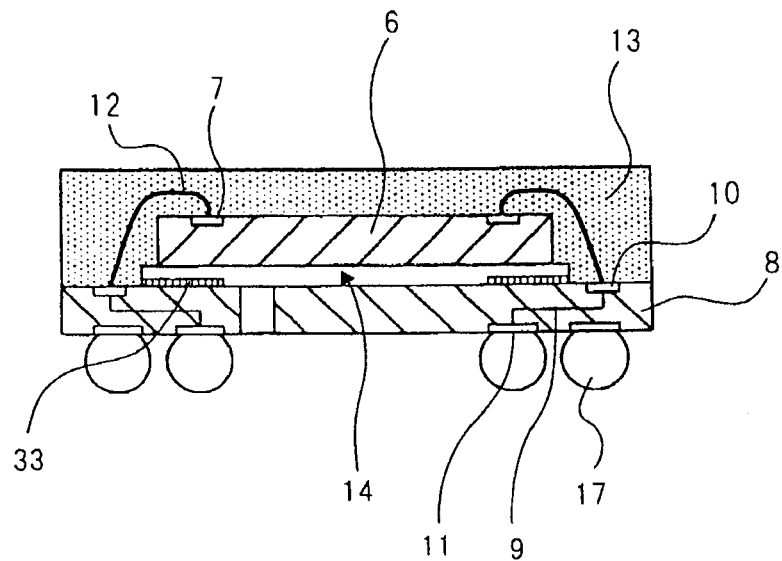
FIG. 13 is a cross-sectional view showing another configuration of the semiconductor device according to the third embodiment.

Also, as shown in FIG. 13, adhesive members 33 may be arranged along the outer peripheral edges of semiconductor chip mounting areas on wiring board 8, in other words, formed in a rectangular frame shape along the outer peripheral edges on the back side of semiconductor chip 6, such that adhesive members 33 are thereby prevented from covering throughholes 15 of wiring board 8. Also, the adhesive member may be formed to define a predetermined pattern in semiconductor chip mounting areas on the wiring board, as required. Throughhole 15, in turn, is only required to communicate with hollow 14, and can be placed freely at any position except for the center of wiring board 8, for example, a position at which no wiring pattern 9 exits.

Figure 14:
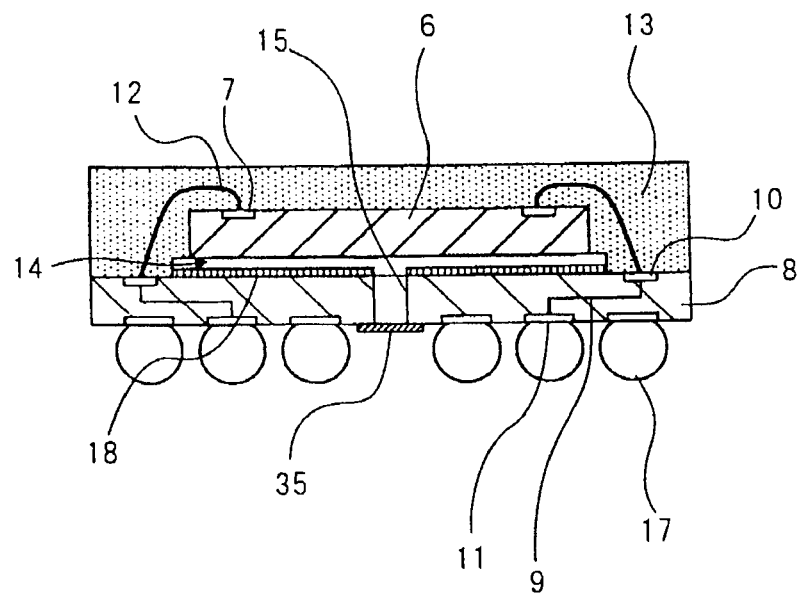
FIG. 14 is a cross-sectional view showing a further configuration of the semiconductor device according to the third embodiment.

Additionally, as shown in FIG. 14, air-permeable sheet member 35 may be provided over the opening of throughhole 15 on the back side of wiring board 8, thereby preventing foreign substances from intruding from throughhole 15.

Figure 15:
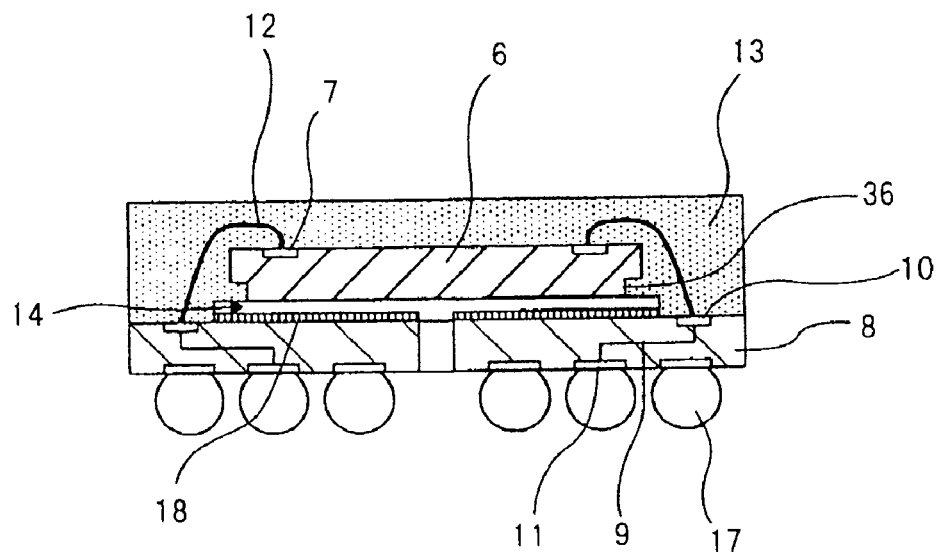
FIG. 15 is a cross-sectional view showing a yet further configuration of the semiconductor device according to the third embodiment.

Additionally, as shown in FIG. 15, plate-shaped semiconductor chip 6 may be formed with recesses 36 on side surfaces, such that the side surfaces come into engagement with sealant 13. According to this configuration, semiconductor chip 6 having its back side placed adjacent to hollow 14 can be prevented from coming off from sealant 13 toward hollow 14. In this regard, semiconductor chip 6 may be formed having one recess or one protrusion or a recess and a protrusion on each of the side surfaces as required, with the result that the side surfaces of semiconductor chip 6 can be securely engaged with sealant 13.

Figure 16:
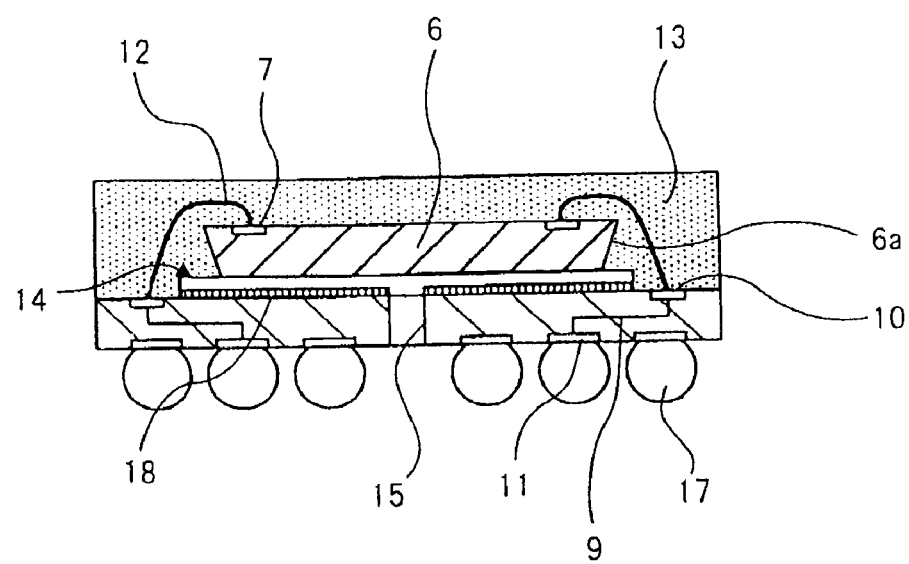
FIG. 16 is a cross-sectional view showing a still further configuration of the semiconductor device according to the third embodiment.

Additionally, side surfaces 6a of semiconductor chip 6 may be formed in a tapered shape, as shown in FIG. 16, in order that semiconductor chip 6 having its back side placed adjacent to hollow 14 is prevented from coming off from sealant 13 toward hollow 14. The tapered side surfaces are formed such that the cross-sectional area of semiconductor chip 6 parallel to the back side thereof becomes gradually smaller toward the back side of semiconductor chip 6. With this configuration, side surfaces 6a of semiconductor chip 6 can be securely engaged with sealant 13 as well.

Figure 17A:
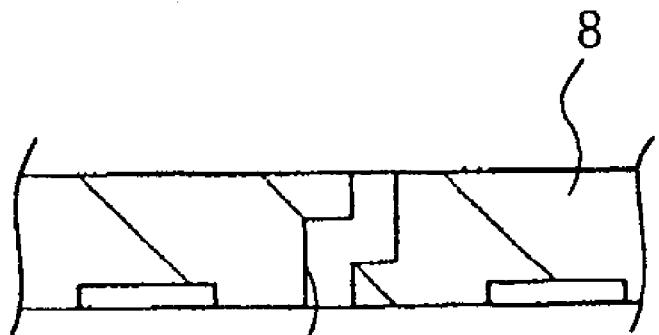
FIGS. 17A-17C are cross-sectional views showing exemplary configurations of throughholes through a wiring board.
Figure 17B:
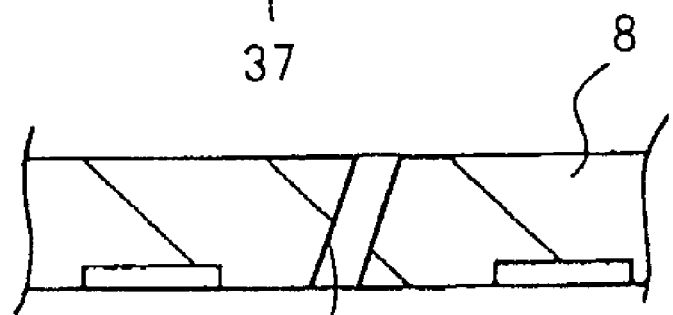

Further, throughhole 37 may be formed to bend in the middle in the depth direction, as shown in FIG. 17A. Alternatively, throughhole 38 may be formed to incline with respect to the thickness direction of wiring board 8, as shown in FIG. 17B. When throughholes 37, 38 are formed having such a configuration, this configuration makes it difficult for foreign substances to enter hollow 14 through throughholes 37, 38.

Figure 17C:
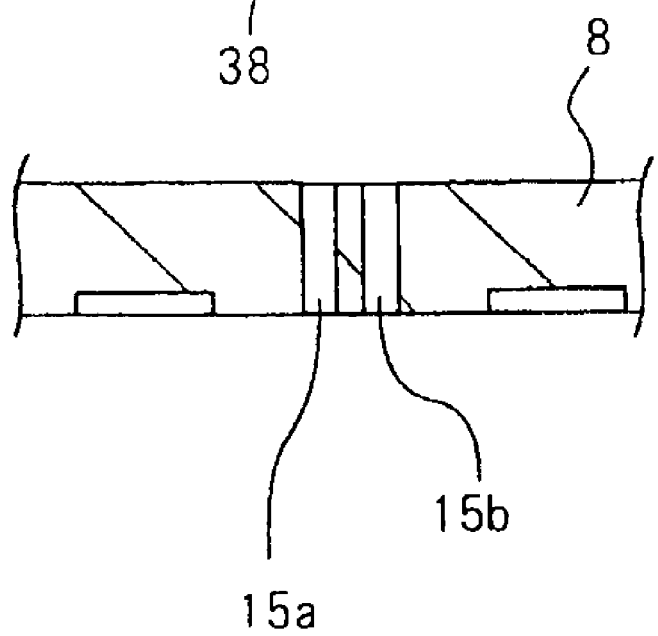

Alternatively, wiring board 8 may be provided with a plurality of throughholes 15a, 15b, as shown in FIG. 17C. When the adhesive member is heated so that it meets and is discharged to the outside from the throughhole, the adhesive can be more readily discharged through a larger number of throughholes. Additionally, a plurality of the aforementioned throughholes 37, 38 may be provided through wiring board 8. In this way, foreign substances can be prevented from intruding into hollow 14, and the melted adhesive member can be smoothly discharged from hollow 14 to the outside.

It is apparent that the present invention is not limited to the above embodiments, but may be modified and changed without departing from the scope and spirit of the invention.

What is claimed is:

1. A semiconductor device comprising:
a semiconductor chip formed with an electrode pad on one surface thereof;
a wiring board having a wiring pattern, said wiring board having one surface opposing the other surface of said semiconductor chip;
a connection member for electrically connecting the electrode pad of said semiconductor chip with the wiring pattern of said wiring board;
an external terminal arranged on the other surface of said wiring board for electrical connection with said electrode pad through said connection member and the wiring pattern; and
a fixing member for fixing said semiconductor chip on the one surface of said wiring board such that a hollow is formed between the other surface of said semiconductor chip and the one surface of said wiring board,
wherein said wiring board includes a throughhole communicating with said hollow,
wherein the size of said hollow in a direction parallel to the other surface of said semiconductor chip is equal to or larger than the size of the other surface of said semiconductor chip.

2. The semiconductor device according to claim 1, wherein said hollow is adjacent to the other surface of said semiconductor chip.

3. A semiconductor device comprising:
a semiconductor chip formed with an electrode pad on one surface thereof;
a wiring board having a wiring pattern, said wiring board having one surface opposing the other surface of said semiconductor chip;
a connection member for electrically connecting the electrode pad of said semiconductor chip with the wiring pattern of said wiring board;
an external terminal arranged on the other surface of said wiring board for electrical connection with said electrode pad through said connection member and the wiring pattern;
a fixing member for fixing said semiconductor chip on the one surface of said wiring board such that a hollow is formed between the other surface of said semiconductor chip and the one surface of said wiring board,
wherein said wiring board includes a throughhole communicating with said hollow; and
an air-permeable sheet member over an opening of said throughhole on the other surface of said wiring board.

4. A semiconductor device comprising:
a semiconductor chip including a plurality of electrode pads arranged on one surface thereof;
a wiring board disposed closer to the other surface of said semiconductor chip, said wiring board having one surface spaced apart from and opposite to the other surface of said semiconductor chip;
a throughhole pierced to extend through said wiring board;
a plurality of connections arranged on the one surface of said wiring board in correspondence to the plurality of electrode pads;
a plurality of external terminals arranged on the other surface of said wiring board;
conductors electrically connecting said connections with said external terminals corresponding to said connections, respectively;
connection members electrically connecting said electrode pads with said connections corresponding to said electrode pads, respectively; and
a fixing member fixing said semiconductor chip on the one surface of said wiring board such that a hollow is formed to continue to the other surface of said wiring board through said through-hole between the other surface of said semiconductor chip and the one surface of said wiring board,
wherein at least a majority portion of the other surface of said semiconductor chip is disposed adjacent to said hollow.

5. A semiconductor device comprising:
a semiconductor chip formed with an electrode pad on one surface thereof;
a wiring board including a wiring pattern, said wiring board including one surface opposing the other surface of said semiconductor chip;
a connection member electrically connecting the electrode pad of said semiconductor chip with the wiring pattern of said wiring board;
an external terminal arranged on the other surface of said wiring board for electrical connection with said electrode pad through said connection member and the wiring pattern; and
a fixing member fixing said semiconductor chip such that a hollow is formed between the other surface of said semiconductor chip and the one surface of said wiring board, and the hollow is filled with air,
wherein the entirety of the other surface of said semiconductor chip is adjacent to said hollow.

6. The semiconductor device according to claim 5, wherein said wiring board includes a through-hole communicating with said hollow, and said through-hole is positioned in a central area of the one surface of said wiring board.

7. The semiconductor device according to claim 5, wherein said semiconductor chip is in the shape of a plate which includes side surfaces which are tapered such that the cross-sectional area of said semiconductor chip parallel to the other surface of said semiconductor chip becomes gradually smaller toward the other surface, or such that each of said side surfaces includes one recess or one protrusion, or one recess and one protrusion.

8. The semiconductor device according to claim 5, wherein said wiring board includes a plurality of said throughholes.

9. The semiconductor device according to claim 5, wherein said wiring board includes a through-hole communicating with said hollow, and said through-hole is bent in the middle in a depth direction, or is inclined with respect to a thickness direction of said wiring board.

10. The semiconductor device according to claim 5, wherein said hollow includes corners formed in an arcuate shape, as viewed in cross section, in a boundary zone of the other surface of said semiconductor chip with said fixing member.

11. A semiconductor device comprising:
a semiconductor chip formed with an electrode pad on one surface thereof;
a wiring board including a wiring pattern, said wiring board including one surface opposing the other surface of said semiconductor chip;
a connection member electrically connecting the electrode pad of said semiconductor chip with the wiring pattern of said wiring board;
an external terminal arranged on the other surface of said wiring board for electrical connection with said electrode pad through said connection member and the wiring pattern; and
a fixing member fixing said semiconductor chip above the one surface of said wiring board such that a hollow is formed between the other surface of said semiconductor chip and the one surface of said wiring board,
wherein the size of said hollow in a direction parallel to the other surface of said semiconductor chip is equal to or larger than the size of the other surface of said semiconductor chip.

12. The semiconductor device according to claim 11, wherein the wiring board includes a through-hole communicating with said hollow.

13. The semiconductor device according to claim 12, further comprising:
a cap provided on the other surface of the wiring-board, the cap is blocking up the through-hole.

14. The semiconductor device according to claim 13, wherein the cap is an air-permeable sheet member.

* * * * *